(12) United States Patent
Choi et al.

(10) Patent No.: US 7,961,508 B2
(45) Date of Patent: Jun. 14, 2011

(54) PHASE-CHANGE RANDOM ACCESS MEMORY

(75) Inventors: Byung-Gil Choi, Yongin-si (KR); Du-Eung Kim, Yongin-si (KR); Woo-Yeong Cho, Suwon-si (KR); Hye-Jin Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/771,028

(22) Filed: Apr. 30, 2010

(65) Prior Publication Data

US 2010/0214832 A1 Aug. 26, 2010

Related U.S. Application Data

(62) Division of application No. 11/616,969, filed on Dec. 28, 2006, now Pat. No. 7,729,160.

(30) Foreign Application Priority Data

Mar. 15, 2006 (KR) .......................... 10-2006-0024049

(51) Int. Cl.
*G11C 11/00* (2006.01)

(52) U.S. Cl. ........ 365/163; 365/46; 365/148; 365/225.7

(58) Field of Classification Search .................... 365/46, 365/100, 148, 163, 225.7, 49.16, 185.09; 257/2–5; 327/51; 438/95, 96, 166, 365, 438/482, 486, 597
See application file for complete search history.

(56) References Cited

U.S. PATENT DOCUMENTS

| | | | | |
|---|---|---|---|---|
| 5,837,564 | A * | 11/1998 | Sandhu et al. | .................. 438/95 |
| 5,901,105 | A * | 5/1999 | Ong et al. | ................ 365/230.06 |
| 5,999,480 | A * | 12/1999 | Ong et al. | ................ 365/230.06 |
| 2002/0000837 | A1 * | 1/2002 | Keeth et al. | ...................... 327/51 |
| 2003/0115518 | A1 * | 6/2003 | Kleveland et al. | ............ 714/718 |

* cited by examiner

*Primary Examiner* — Richard Elms
*Assistant Examiner* — Harry W Byrne
(74) *Attorney, Agent, or Firm* — F. Chau & Associates, LLC

(57) ABSTRACT

A phase-change random access memory includes a memory block including a plurality of memory columns corresponding to the same column address and using different input/output paths; a redundancy memory block including a plurality of redundancy memory columns using different input/output paths; and an input/output controller repairing at least one of the plurality of memory columns using at least one of the plurality of redundancy memory columns, and controlling the number of memory columns simultaneously repaired using redundancy memory columns in response to an input/output repair mode control signal.

12 Claims, 8 Drawing Sheets

US 7,961,508 B2

PHASE-CHANGE RANDOM ACCESS MEMORY

CROSS-REFERENCE TO RELATED APPLICATION

This application is a divisional of U.S. patent application Ser. No. 11/616,969, filed on Dec. 28, 2006, now U.S. Pat. No. 7,729,160, which, in turn, claims priority from Korean Patent Application No. 10-2006-0024049 filed on Mar. 15, 2006, the disclosures of which are all incorporated by reference herein in their entireties.

BACKGROUND OF THE INVENTION

1. Technical Field

The present disclosure relates to a phase-change random access memory and, more particularly, to a phase-change random access memory with improved repair efficiency and reliability.

2. Discussion of the Related Art

Phase-change random access memories (PRAMs) store data using a phase-change material, for example, a chalcogenide alloy, that goes into a crystalline state or an amorphous state due to a change in temperature such as cooling followed by heating. Since the resistance of a crystalline phase-change material is low, whereas the resistance of an amorphous phase-change material is high, the crystalline state is referred to as a set or "0" state and the amorphous state is referred to as a reset or "1" state.

In an input/output (I/O) repair scheme of a PRAM, failed memory columns of a memory block are replaced with redundancy memory columns. In the PRAM, at least one or more failed memory columns can be simultaneously repaired by at least one or more redundancy memory columns. For example, when the I/O repair mode is set to a ×1 mode, failed memory columns are repaired one by one. When the I/O repair mode is set to a ×2 mode, failed memory columns are repaired two by two.

A memory block typically includes a plurality of memory columns corresponding to the same column address and uses different input/output paths, such that a plurality of bits are simultaneously input and output.

In such a memory block, the repair efficiency and reliability of the I/O repair mode may vary according to the location of a failed memory column. Specifically, in the ×1 mode, failed memory columns are repaired one by one, thus exhibiting high repair efficiency. However, in a case where failures occur to two memory columns corresponding to the same column address and using different I/O paths, the failed two memory columns cannot be repaired in the ×1 mode, resulting in a deterioration in reliability. Furthermore, since failed memory columns are repaired two by two in the ×2 mode, even when failures occur to two memory columns corresponding to the same column address and using different I/O paths, the failed two memory columns can still be repaired. Thus, the ×2 mode exhibits better reliability than the ×1 mode.

SUMMARY OF THE INVENTION

Exemplary embodiments of the present invention provide a phase-change random access memory with improved repair efficiency and reliability.

According to an exemplary embodiment of the present invention, there is provided a phase-change random access memory including a memory block having a plurality of memory columns corresponding to the same column address and using different input/output paths, a redundancy memory block including a plurality of redundancy memory columns using different input/output paths, and an input/output controller repairing at least one of the plurality of memory columns using at least one of the plurality of redundancy memory columns, and controlling the number of memory columns simultaneously repaired using the redundancy memory columns in response to an input/output repair mode control signal.

According to an exemplary embodiment of the present invention, there is provided a phase-change random access memory including a memory block having a plurality of memory columns corresponding to the same column address and using different input/output paths, a redundancy memory block including a plurality of redundancy memory columns using different input/output paths, and a plurality of column address fuse boxes corresponding to the plurality of redundancy memory columns, each of the plurality of column address fuse boxes receiving a column address. In which it is determined whether the plurality of memory columns include at least one repaired memory column, and providing a designation signal for designating the at least one repaired memory column among the plurality of memory columns. Also included is a control fuse box providing an input/output repair mode control signal for designating input/output repair modes, an input/output decoder receiving and decoding the designation signal and the input/output repair mode control signal and providing a plurality of path selection signals, and a plurality of path selection circuits receiving the plurality of path selection signals and disabling input/output paths of the at least one repaired memory column and enabling redundancy input/output paths of the at least one redundancy memory column to replace the at least one repaired memory column.

According to an exemplary embodiment of the present invention, there is provided a phase-change random access memory including a memory block having a plurality of memory subblocks and a plurality of memory columns corresponding to the same column address, each of the plurality of memory columns is arranged in each of the plurality of memory subblocks, a plurality of sense amplifiers and/or write drivers arranged corresponding to the plurality of memory subblocks, a redundancy memory block including a plurality of redundancy memory columns, and a plurality of repair sense amplifiers and/or write drivers arranged corresponding to the plurality of redundancy memory columns, a plurality of column address fuse boxes corresponding to the plurality of redundancy memory columns, each of the plurality of column address fuse boxes receiving a column address. In which it is determined whether the plurality of memory columns include at least one repaired memory column, and providing a designation signal for designating the at least one repaired memory column among the plurality of memory columns. Also included is a control fuse box providing an input/output repair mode control signal for designating input/output repair modes, an input/output decoder receiving and decoding the designation signal and the input/output repair mode control signal and providing a plurality of path selection signals, and a plurality of path selection circuits being connected to the plurality of sense amplifiers and/or write drivers through a plurality of data lines, respectively, at least one of the plurality of path selection circuits connected to each of the plurality of repair sense amplifiers and/or write drivers through a plurality of redundancy data lines, and the plurality of path selection circuits selectively inputting/outputting data through the plurality of data lines or the plurality of redundancy data lines.

According to an exemplary embodiment of the present invention, there is provided a phase-change random access memory including a plurality of memory blocks, each of the plurality of memory blocks including a plurality of memory columns corresponding to the same column address and using different input/output paths, a redundancy memory block including a plurality of redundancy memory columns using different input/output paths, and a plurality of input/output repair control circuits arranged corresponding to the plurality of memory blocks, each of the plurality of input/output repair control circuits repairing at least one of the plurality of memory columns according to input/output repair modes using at least one of the plurality of redundancy memory columns, and at least two of the plurality of input/output repair control circuits having different input/output repair modes.

BRIEF DESCRIPTION OF THE DRAWINGS

Exemplary embodiments of the present invention can be understood in more detail from the following descriptions taken in conjunction with the attached drawings in which.

DETAILED DESCRIPTION OF THE INVENTION

Figure 1:
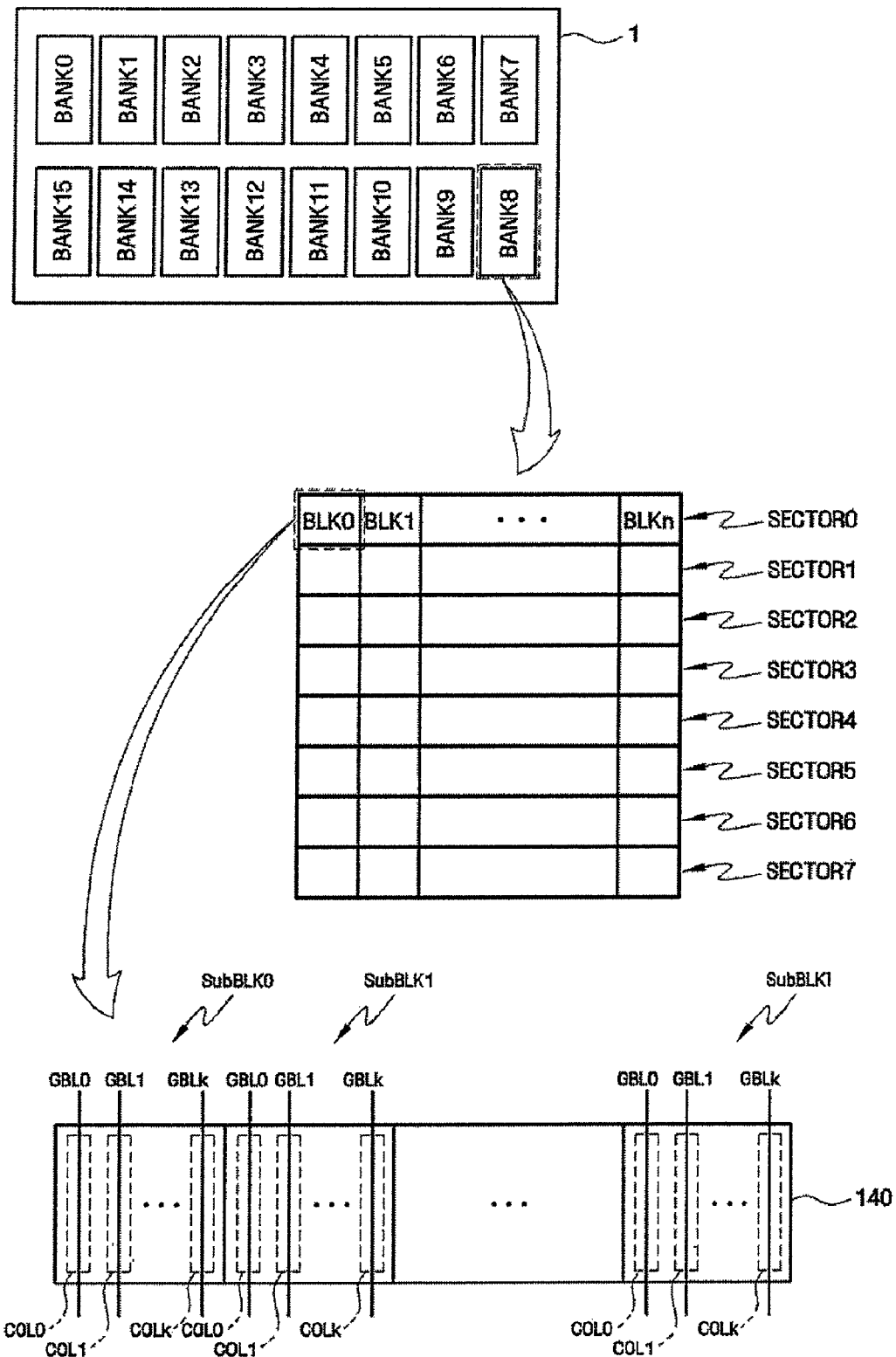
FIG. 1 is a block diagram representing a phase-change random access memory according to an exemplary embodiment of the present invention.

FIG. 1 is an exemplary block diagram representing a phase-change random access memory (PRAM) 1 according to an exemplary embodiment of the present invention.

Referring to FIG. 1, the PRAM 1 may include a plurality of memory banks (BANKi; i=0~15). The plurality of memory banks (BANKi; i=0~15) may have a layered structure. Each of the plurality of memory banks (BANKi; i=0~15) may include a plurality of memory sectors (SECTORj; j=0~7). Each of the plurality of memory sectors (SECTORj; j=0~7) may include a plurality of memory blocks (BLKk; k=0~n).

In addition, each of the plurality of memory blocks (BLKk; k=0~n) may include a plurality of memory subblocks (subBLKr; r=0~1). The plurality of memory subblocks (sub-BLKr; r=0~1) may include a plurality of memory columns (COLs; s=0~k) corresponding to the same column addresses (GBLs; s=0~k). The memory columns (COLs; s=0~k) corresponding to the same column addresses (GBLs; s=0~k) are disposed in the respective memory subblocks (subBLKr; r=0~1). Therefore, the corresponding memory columns (e.g., COL0) within the plurality of memory subblocks (subBLKr; r=0~1) can be simultaneously accessed through a single column address, for example, GBL0, so that multiple bits can be simultaneously input/output to the plurality of memory columns (COLs; s=0~k).

Figure 2:
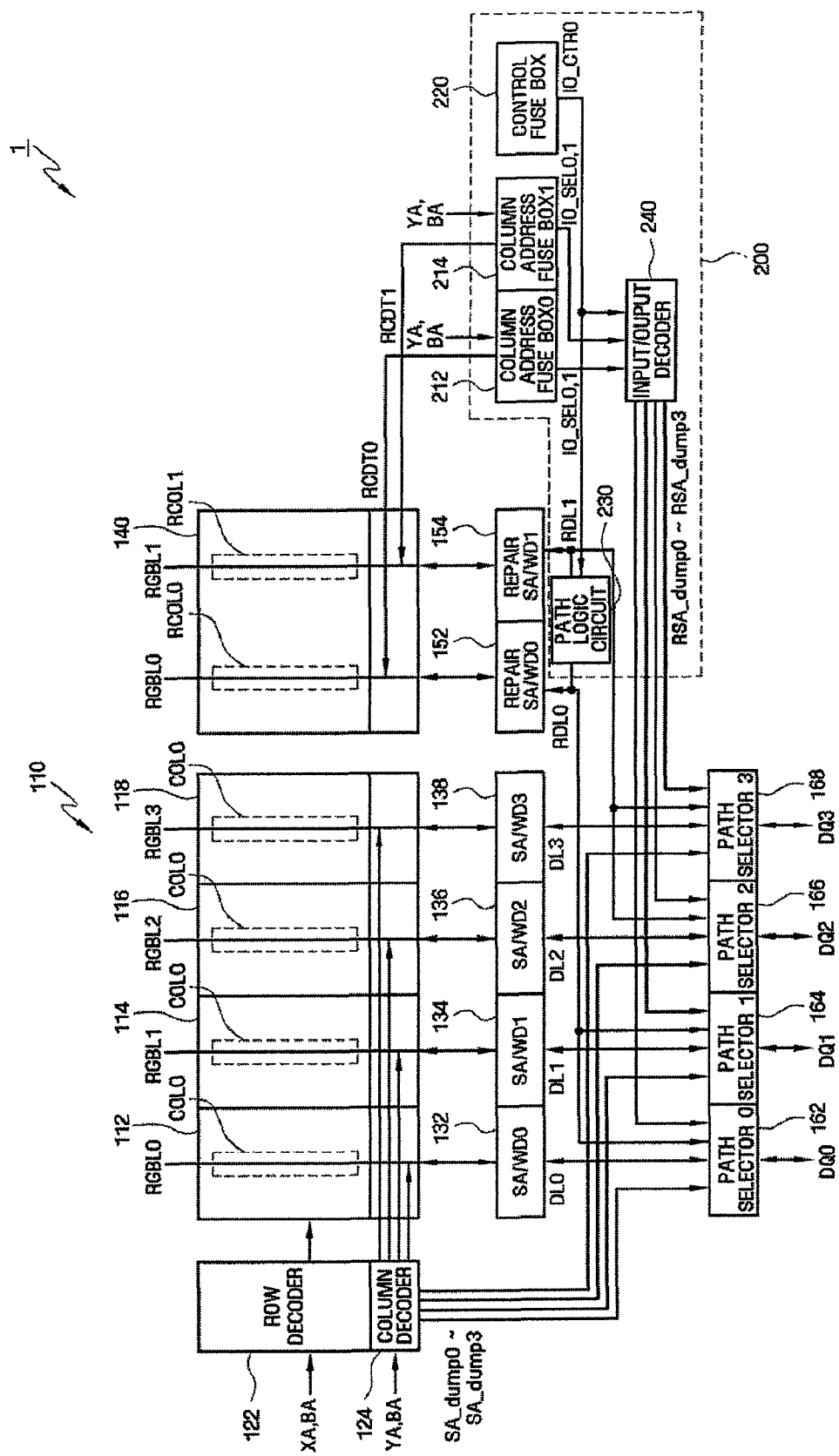
FIG. 2 is a block diagram of the phase-change random access memory according to an exemplary embodiment of the present invention.
Figure 3:
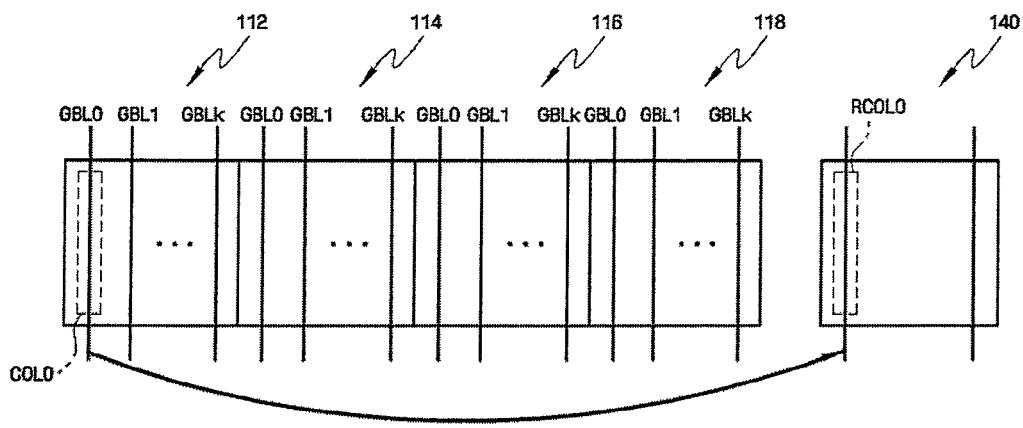
FIGS. 3 and 4 are conceptual diagrams illustrating input/output repair operations of the phase-change random access memory according to an exemplary embodiment of the present invention.
Figure 4:
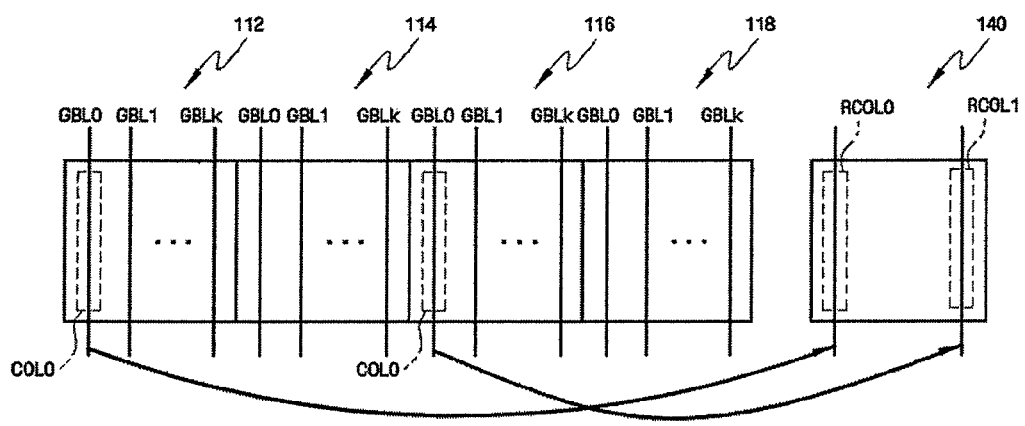

FIG. 2 is a block diagram of the PRAM 1 according to an exemplary embodiment of the present invention, and FIGS. 3 and 4 are conceptual diagrams illustrating input/output repair operations of the PRAM 1 according to an exemplary embodiment of the present invention.

Referring to FIG. 2, the PRAM 1 according to an exemplary embodiment of the present invention may be selectively set in an input/output repair mode according to locations of failed memory columns. In the following description, the PRAM 1 set in one of ×1 and ×2 modes as the I/O repair mode is illustrated.

The PRAM 1 according to an exemplary embodiment of the present invention includes a memory block 110, a row decoder 122, a column decoder 124, a plurality of sense amplifiers and/or write drivers (SA/WD0~SA/WD3) 132, 134, 136, and 138, a redundancy memory block 140, a plurality of repair sense amplifiers and/or write drivers (REPAIR SA/WD0 and REPAIR SA/WD1) 152 and 154, an input/output (I/O) repair controller 200, and a plurality of path selection circuits 162, 164, 166, and 168.

The memory block 110 includes a plurality of memory subblocks 112, 114, 116, and 118. The plurality of memory subblocks 112, 114, 116, and 118 includes the plurality of memory columns (e.g., COL0) corresponding to the same column address and are disposed at the plurality of memory subblocks 112, 114, 116, and 118, respectively, such that the respective memory columns (COL0) have different input/output paths.

The row decoder 122 receives and decodes a row address XA and a bank address BA to designate rows at the memory block 110 and the redundancy memory block 140. The column decoder 124 receives and decodes a column address YA and a bank address BA to designate a column at the memory block 110.

The plurality of sense amplifiers and/or write drivers (SA/WD0~SA/WD3) 132, 134, 136, and 138 correspond to and are disposed at the plurality of memory subblocks 112, 114, 116, and 118, respectively, and the plurality of memory subblocks 112, 114, 116, and 118 use different sense amplifiers and/or write drivers (SA/WD0~SA/WD3) 132, 134, 136, and 138.

The redundancy memory block 140 includes a plurality of redundancy memory columns RCOL0, and RCOL1. Since the plurality of redundancy memory columns RCOL0, and RCOL1 use different redundancy input/output paths, the plurality of repair sense amplifiers and/or write drivers (REPAIR SA/WD0 and REPAIR SA/WD1) 152 and 154 correspond to and are disposed at the plurality of redundancy memory columns RCOL0 and RCOL1, respectively, and the respective redundancy memory columns RCOL0 and RCOL1 use different repair sense amplifiers and/or write drivers (REPAIR SA/WD0 and REPAIR SA/WD1) 152 and 154.

Although not shown, the memory block 110 and the redundancy memory block 140 include a plurality of phase-change material (PCM) cells. Each of the PCM cells changes between an amorphous state and a crystalline state depending on the current flowing through it and includes a variable resistor containing a phase-change material and an access element controlling current flowing through the variable resistor.

The access element may be a diode connected in series to the variable resistor. In addition, the phase-change material may be a binary (two-element) compound such as GaSb, InSb, InSe. $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb (SeTe), or $Te_{81}Ge_{15}Sb_2S_2$. The most commonly used phase-change material is GeSbTe.

The input/output (I/O) repair controller 200 sets a predetermined I/O repair mode according to the location of a failed memory column, at least one failed memory column COL0 can be repaired by at least one redundancy memory column RCOL0 and RCOL1. The I/O repair mode means the number of memory columns COL0 simultaneously repaired using redundancy memory columns RCOL0 and RCOL1. For example, when the I/O repair mode is set to a ×1 mode, failed memory columns are repaired one by one. When the I/O repair mode is set to a ×2 mode, failed memory columns are repaired two by two.

Specifically, with reference to FIG. 3, when the first memory column COL0 within the first memory subblock 112 has failed, the PRAM according to an exemplary embodiment of the present invention can be set to a ×1 mode. First memory column COL0 within first memory subblock 112 can be repaired using first redundancy memory column RCOL0.

Meanwhile, with reference to FIG. 4, when the first and third memory columns COL0 within the first and third memory subblocks 112 and 114 have failed, the PRAM can be set to a ×2 mode. The first and third memory columns COL0 within the first and third memory subblocks 112 and 114 can be repaired using the first and second redundancy memory columns RCOL0 and RCOL1, respectively.

Referring to FIG. 2 again, the input/output (I/O) repair controller 200 includes a pair of column address fuse boxes 212 and 214, a control fuse box 220, a path logic circuit 230, and an input/output (I/O) decoder 240.

The pair of column address fuse boxes 212 and 214 are disposed corresponding to the redundancy memory columns RCOL0 and RCOL1, respectively. Each of the column address fuse boxes 212 and 214 stores a column address of the repaired memory column COL0, receives an external column address, determines whether the external column address is identical with the stored column address and, if identical, provides a redundancy column selection signal for selecting the redundancy memory columns RCOL0 and RCOL1 to replace the repaired memory column COL0.

In addition, the column address fuse boxes 212 and 214 provide designation signals IO_SEL0 and IO_SEL1 for designating the plurality of memory subblocks 112, 114, 116, and 118 including the repaired memory column COL0. The designation signals IO_SEL0 and IO_SEL1 are used to designate the repaired memory column COL0 among the plurality of memory columns corresponding to the same column address.

The column address fuse boxes 212 and 214 will later be described in greater detail with reference to FIGS. 5 to 7.

The control fuse box 220 provides an I/O repair mode control signal IO_CTR0 for setting an I/O repair mode to the path logic circuit 230 and the I/O decoder 240. For example, when the ×1 mode is set as the I/O repair mode, a high level signal is provided. When the ×2 mode is set as the I/O repair mode, a low level signal is provided. The control fuse box 220 will later be described in greater detail with reference to FIG. 8.

The path logic circuit 230 is connected between the redundancy data lines RDL0 and RDL1 connected to the repair sense amplifier and/or write drivers (REPAIR SA/WD0 and REPAIR SA/WD1) 152 and 154, and is turned on in response to the I/O repair mode control signal IO_CTR0. For example, the path logic circuit 230 is turned on in the ×1 mode to allow the redundancy data lines RDL0 and RDL1 to be merged with each other and turned off in the ×2 mode to allow the redundancy data lines RDL0 and RDL1 to be isolated from each other.

The I/O decoder 240 receives and decodes designation signals IO_SEL0 and IO_SEL1 and an I/O repair mode control signal IO_CTR0 and provides a plurality of first I/O path selection signals RSA_dump0~RSA_dump3. For example, in the ×1 mode, only one first I/O path selection signal RSA_dump0 becomes logic high and the other first I/O path selection signals RSA_dump1, RSA_dump2, and RSA_dump3 become logic low. In addition, in the ×2 mode, two first I/O path selection signals RSA_dump0 and RSA_dump2 become logic high and the other first I/O path selection signals RSA_dump1 and RSA_dump3 become logic low. The I/O decoder 240 will later be described in greater detail with reference to FIG. 9.

The plurality of path selection circuits 162, 164, 166, and 168 receive the first and second I/O path selection signals RSA_dump0~RSA_dump3, and SA_dump0~SA_dump3, enables I/O paths associated with unrepaired memory column, and enables redundancy I/O paths of the redundancy memory columns RCOL0 and RCOL1 to disable and replace I/O paths associated with the repaired memory column COL0. The second I/O path selection signals SA_dump0~SA_dump3 are produced by decoding the column addresses.

In more detail, the sense amplifiers and/or write drivers (SA/WD0~SA/WD3) 132, 134, 136, and 138 are connected to the plurality of path selection circuits 162, 164, 166, and 168 through data lines DL0, DL1, DL2, and DL3, respectively. The repaired sense amplifiers and/or write drivers (REPAIR SA/WD0 and REPAIR SA/WD1) 152 and 154 are connected to at least one plurality of path selection circuits 162, 164, 166, and 168 through the redundancy data lines RDL0 and RDL1. Thus, the plurality of path selection circuits 162, 164, 166, and 168 selectively input and/or output bits through the data lines DL0, DL1, DL2, and DL3 or the redundancy data lines RDL0 and RDL1 in response to the first I/O path selection signals RSA_dump0~RSA_dump3.

In an example, in the ×1 mode, the I/O path selection circuit 162, which has been provided with the first I/O path selection signal RSA_dump0 of a high level, inputs and outputs data through the redundancy data line RDL0. The I/O path selection circuits 153, 166 and 168, which have been provided with the first I/O path selection signals RSA_dump1, RSA_dump2, and RSA_dump3 of a low level, input and output data through the data lines DL1, DL2 and DL3.

In the ×2 mode, the I/O path selection circuits 162 and 166, which have been provided with the first I/O path selection signals RSA_dump0 and RSA_dump2 of a high level, input and output data through the redundancy data lines RDL0 and RDL1. The I/O path selection circuits 164 and 168, which have been provided with the first I/O path selection signals RSA_dump1 and RSA_dump3 of a low level, input and output data through the data lines DL1 and DL3.

The plurality of path selection circuits 162, 164, 166, and 168 will later be described in greater detail with reference to FIG. 10.

The phase-change random access memories according to an exemplary embodiment of the present invention can adaptively change I/O repair modes according to locations of the failed memory columns, thereby improving repair efficiency and reliability.

Figure 5:
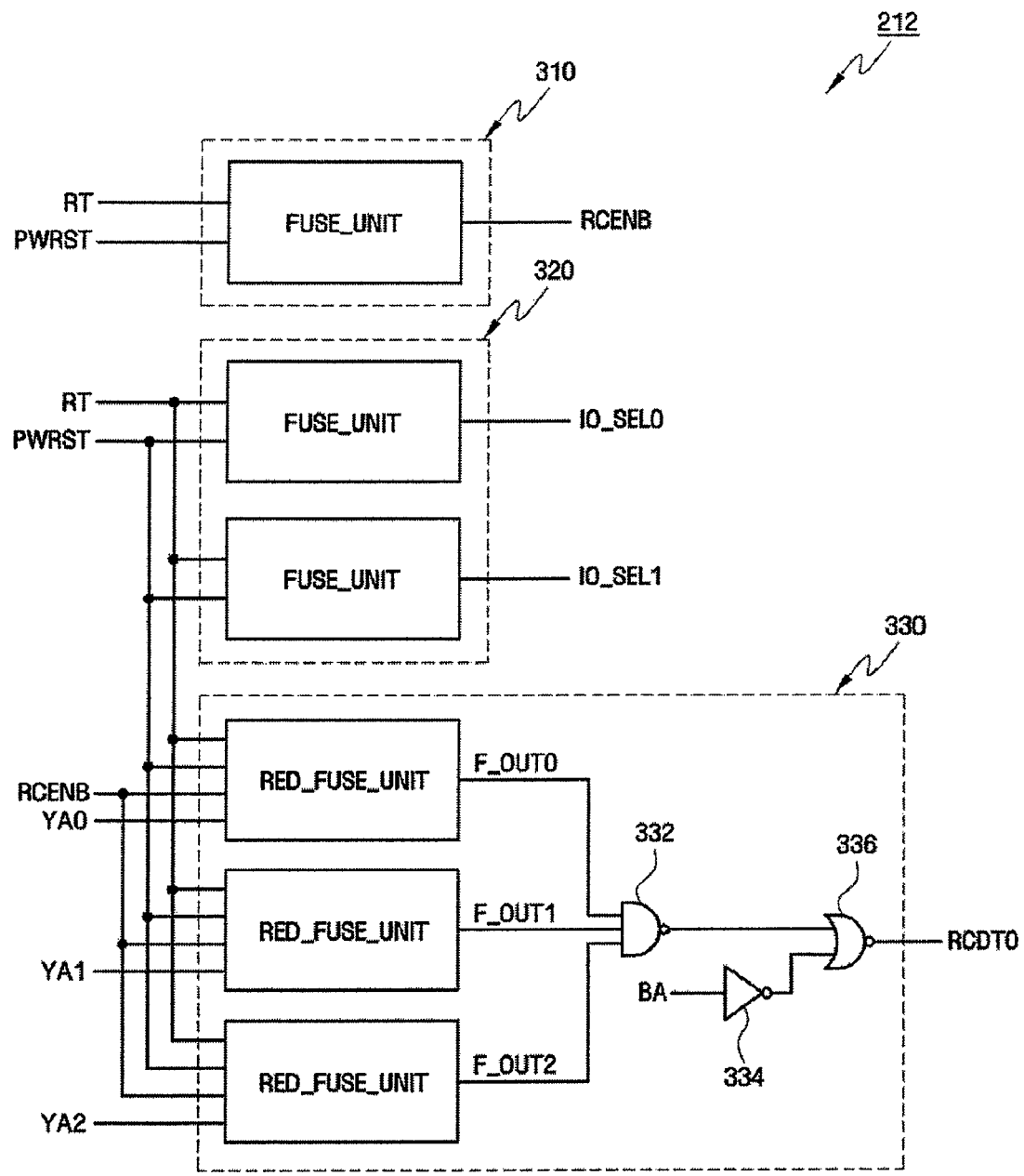
FIG. 5 is a block diagram of a column address fuse box used in the system shown in FIG. 2.
Figure 6:
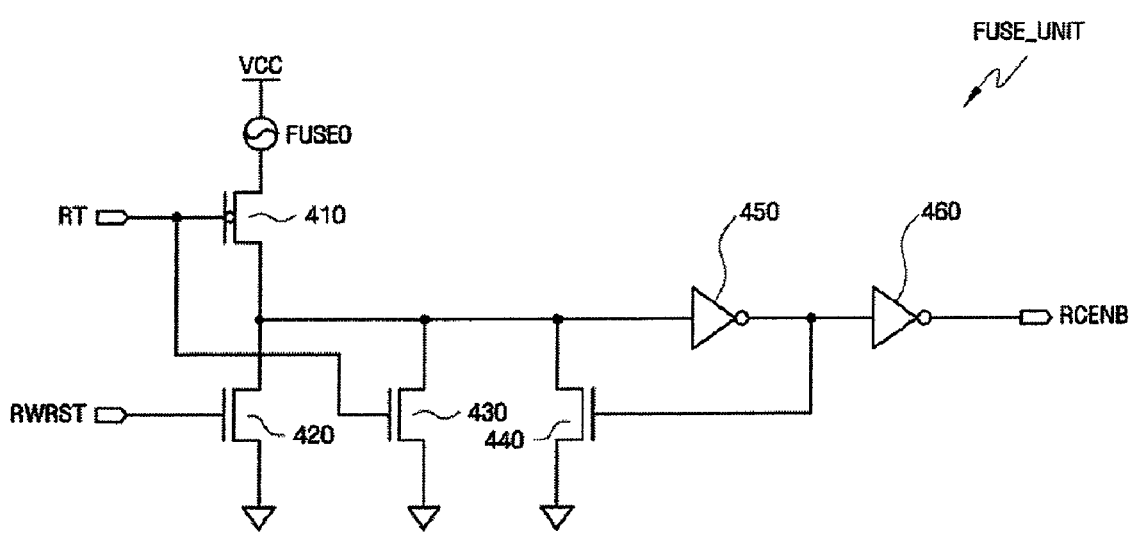
FIG. 6 is a circuit diagram illustrating a master fuse unit and an input/output information fuse unit used in the system shown in FIG. 5.
Figure 7:
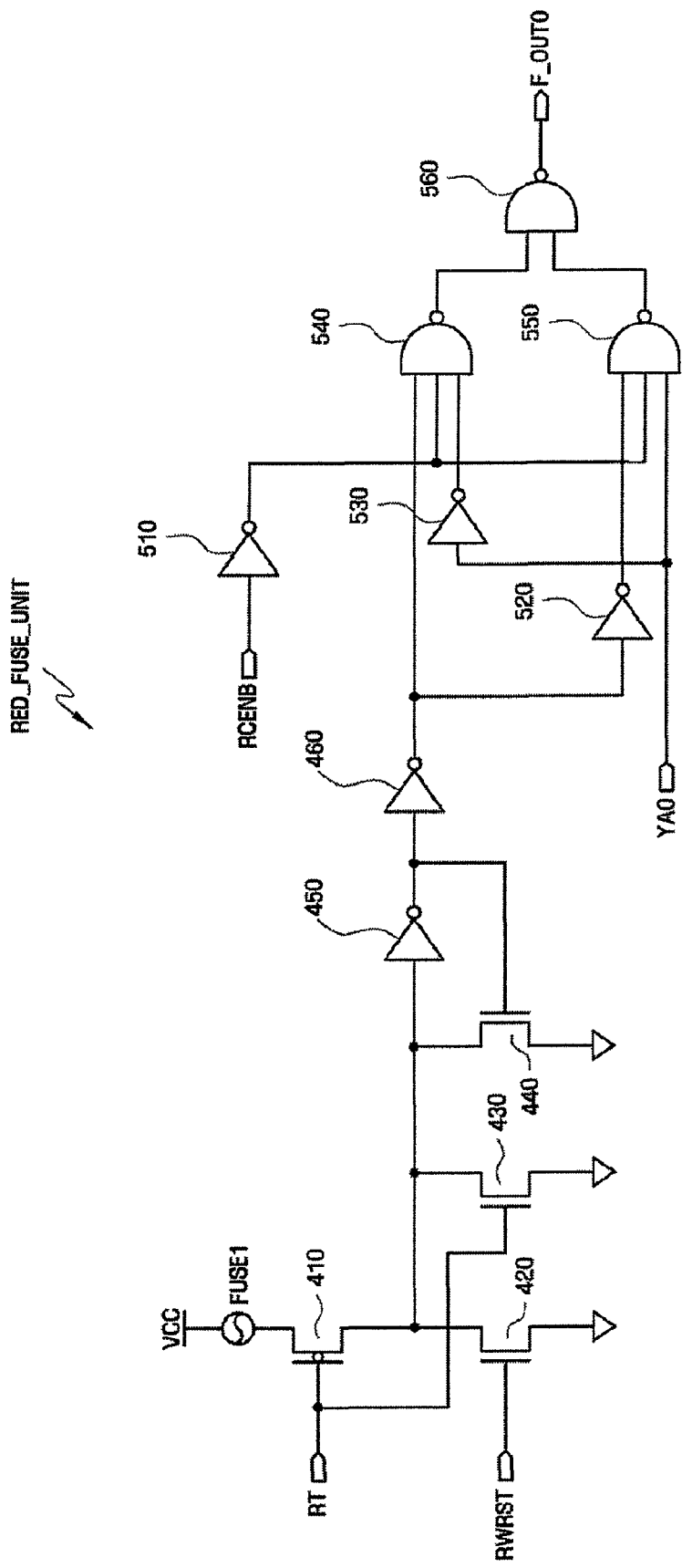
FIG. 7 is a circuit diagram illustrating a column address fuse used in the system shown in FIG. 5.

FIG. 5 is a block diagram of a column address fuse box 212 shown in FIG. 2, FIG. 6 is a circuit diagram illustrating a master fuse unit and an input/output information fuse unit shown in FIG. 5 and FIG. 7 is a circuit diagram illustrating a column address fuse shown in FIG. 5.

Referring first to FIG. 5, the column address fuse box 212 includes a master fuse unit 310, an I/O information fuse unit 320, and a column address fuse unit 330.

The master fuse unit 310, the I/O information fuse unit 320, and the column address fuse unit 330 may receive a repair test signal RT and a reset signal PWRST, respectively. The repair test signal RT is a test signal for checking whether each of the fuse units 310, 320, and 330 operates properly after fabrication of the phase-change random access memory is completed. The reset signal PWRST is a signal activated to a high level when a power supply voltage supplied to the phase-change random access memory reaches a predetermined level. Thus, during the normal operation of the phase-change random access memory, the repair test signal RT is at a logic low level and the reset signal PWRST is at a logic high level.

Referring to FIGS. 5 and 6, the master fuse unit 310 provides a master signal RCENB that enables the column address fuse unit 330. The master fuse unit 310 comprises a fuse unit FUSE_UNIT, which includes a master fuse FUSE0, a PMOS transistor 410, NMOS transistors 420, 430, and 440, and inverters 450 and 460. When the phase-change random access memory is repaired, the master fuse FUSE0 is cut and the master signal RCENB becomes logic low. When the phase-change random access memory is not repaired, the master fuse FUSE0 is not cut and the master signal RCENB becomes logic high.

The I/O information fuse unit 320 provides designation signals IO_SEL0 and IO_SEL1 for designating memory subblocks including repaired memory columns. The I/O information fuse unit 320 may include plurality of fuse units FUSE_UNIT. The memory subblocks are designated according to the designation signals IO_SEL0 and IO_SEL1, as shown in Table 1.

TABLE 1

| IO_SEL0 | IO_SEL1 | Memory subblock |
| --- | --- | --- |
| L | L | 1st memory subblock |
| L | H | 2nd memory subblock |
| H | L | 3rd memory subblock |
| H | H | 4th memory subblock |

Referring to FIGS. 5 and 7, the column address fuse unit 330 stores column addresses of repaired memory columns, receives external column addresses YA1, YA2, and YA3, and determines whether the external column addresses YA1, YA2, and YA3 are identical with the stored column addresses.

The column address fuse unit 330 may include a plurality of redundancy fuse units RED_FUSE_UNIT, a NAND gate 332, an inverter 334, and a NOR gate 336. In the plurality of redundancy fuse units RED_FUSE_UNIT, when the external column addresses YA1, YA2, and YA3 are identical with the stored column addresses, suggesting that output signals F_OUT0, F_OUT1, and F_OUT2 of the plurality of redundancy fuse units RED_FUSE_UNIT become logic high and the block address BA becomes logic high, the redundancy column selection signal RCDTO becomes logic high.

The redundancy fuse unit RED_FUSE_UNIT includes a column address fuse FUSE1, a PMOS transistor 410, NMOS transistors 420, 430, and 440, inverters 450, 460, 510, 520, and 530, and NAND gates 540, 550, and 560. As shown in Table 2, when the master signal RCENB is at a logic low level and the column address fuse FUSE1 is cut, or when the column address YA0 is at a logic high, the column address fuse FUSE1 is not cut, and the column address YA0 is at a logic low, the output signal F_OUT0 becomes logic high.

TABLE 2

| RCENB | FUSE1 | YA0 | F_OUT0 |
| --- | --- | --- | --- |
| L | Cut | H | H |
| | | L | L |
| | Not cut | H | L |
| | | L | H |

Figure 8:
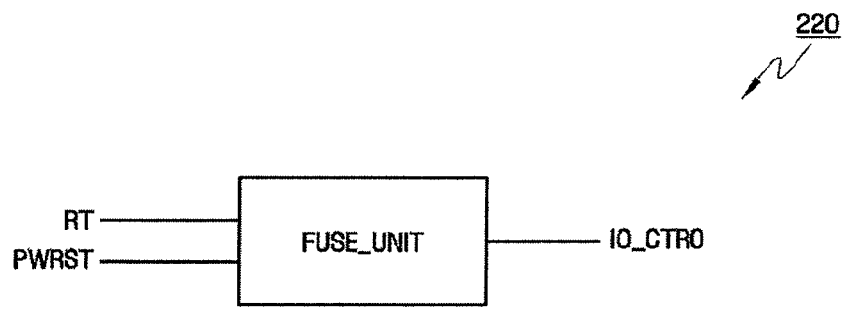
FIG. 8 is a block diagram of a control fuse box used in the system shown in FIG. 2.

FIG. 8 is a block diagram of the control fuse box used in the system shown in FIG. 2.

Referring to FIG. 8, the control fuse box 220 includes the fuse unit FUSE_UNIT shown in FIG. 6. In a ×1 mode, a control fuse is not cut and the I/O repair mode control signal IO_CTR0 becomes logic high. In a ×2 mode, the control fuse is cut and the I/O repair mode control signal IO_CTR0 becomes logic low.

Figure 9:
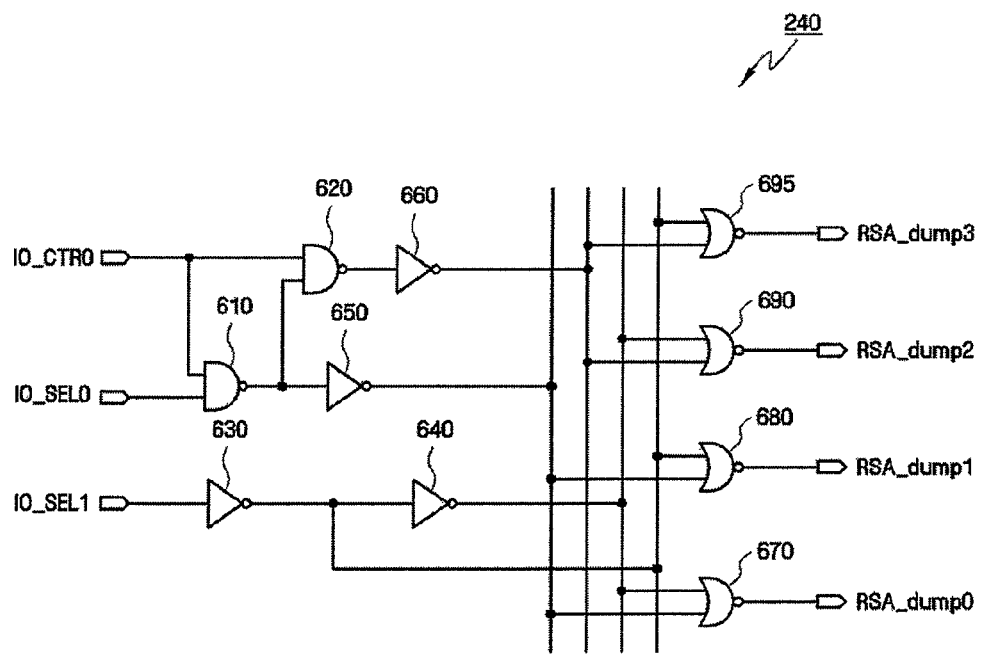
FIG. 9 is a circuit diagram illustrating an input/output decoder used in the system shown in FIG. 2.

FIG. 9 is a circuit diagram illustrating the input/output decoder used in the system shown in FIG. 2.

Referring to FIG. 9, the I/O decoder 240 receives the designation signals IO_SEL0 and IO_SEL1, and the I/O repair mode control signal IO_CTR0, decodes the same and generates a plurality of first I/O path selection signals RSA_dump0~RSA_dump3. The I/O decoder 240 includes NAND gates 610 and 620, inverters 630, 640, 650, and 660, and NOR gates 670, 680, 690, and 695.

The first I/O path selection signals RSA_dump0~RSA_dump3 that are output as logic high level signals according to the designation signals IO_SEL0 and IO_SEL1 and the I/O repair mode control signal IO_CTR0 are summarized below in Table 3.

TABLE 3

| IO_CTR0 | IO_SEL0 | IO_SEL1 | RSA_dump |
| --- | --- | --- | --- |
| H (×1 mode) | L | L | RSA_dump0 |
| | L | H | RSA_dump1 |
| | H | L | RSA_dump2 |
| | H | H | RSA_dump3 |
| L (×2 mode) | don't care | L | RSA_dump0,2 |
| | | H | RSA_dump1,3 |

Figure 10:
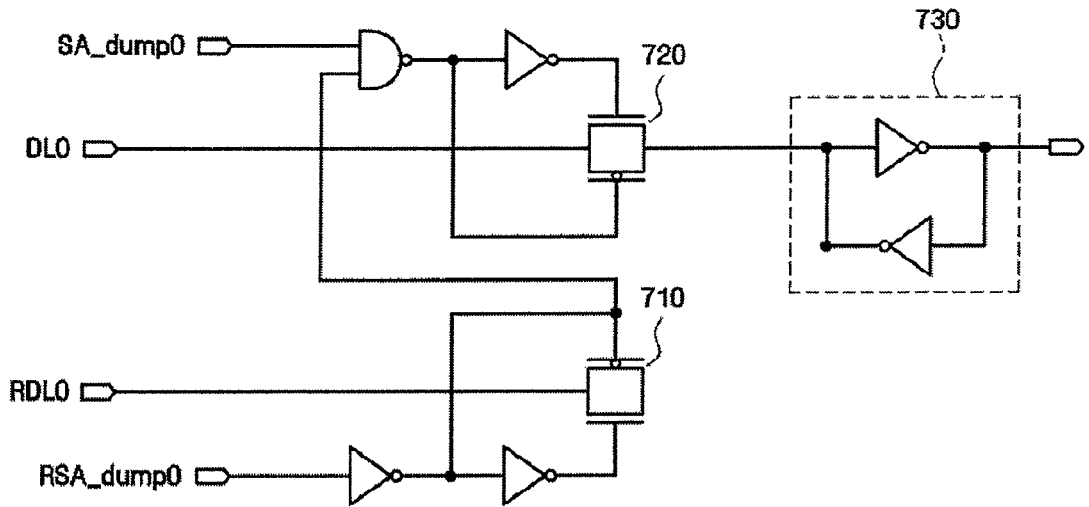
FIG. 10 is a circuit diagram illustrating a path selector circuit used in the system shown in FIG. 2.

FIG. 10 is a circuit diagram illustrating the path selector circuit 162 used in the system shown in FIG. 2.

Referring to FIG. 10, the path selector circuit includes first and second path logic circuits 710 and 720, and a latch 730.

If the first I/O path selection signal RSA_dump0 of a logic high level is applied to the first logic circuit 710, the first path logic circuit 710 is turned on and the second path logic circuit 720 is turned off, irrespective of a logic level of the second I/O path selection signal SA_dump0. Accordingly, the data supplied through the redundancy data line RDL0 is delivered to and stored in the latch 730 while the data supplied through the data line DL0 is not delivered to the latch 730.

In an exemplary embodiment of the present invention, the I/O repair control circuit 200 of FIG. 2 selects one of a ×1 mode and a ×2 mode but the invention is not limited thereto. That is to say, numerous variations in selecting one of a variety of I/O repair modes may be implemented simply by varying the configuration of the I/O repair control circuit 200. Examples of such variations include selecting one of ×1, ×2, and ×4 modes, selecting one of ×1 and ×2 modes, selecting one of ×2 and ×4 modes, selecting one of ×4 and ×8 modes, selecting one of ×8 and ×16 modes, selecting one of ×4, ×8, and ×16 modes, and so on.

Figure 11:
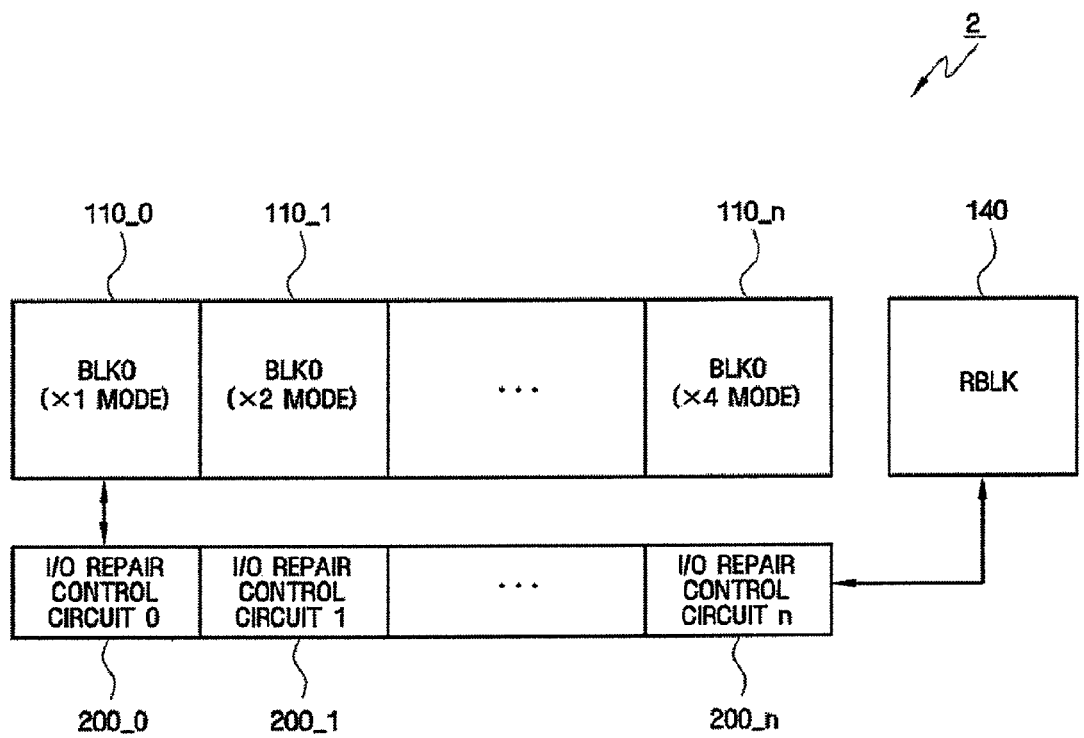
FIG. 11 is a schematic block diagram representing a phase-change random access memory according to an exemplary embodiment of the present invention.

FIG. 11 is a schematic block diagram representing a PRAM 2 according to an exemplary embodiment of the present invention, in which for descriptive convenience, a row decoder, a column decoder, a sense amplifier and/or write driver, and other circuits are not shown. The elements having the same functions as those in the system shown in FIG. 2 are denoted by the same reference numerals, and a detailed description thereof is omitted.

Referring to FIG. 11, the PRAM 2 according to an exemplary embodiment of the present invention includes a plurality of memory blocks 110_0~110_n, a redundancy memory block 140, and a plurality of I/O repair control circuits 200_0~200_n.

The plurality of I/O repair control circuits 200_0~200_n are arranged corresponding to the respective plurality of memory blocks 110_0~110_n, and each of the I/O repair control circuits 200_0~200_n controls the I/O repair mode of each of a respective plurality of memory blocks 110_0~110_n. Therefore, in the PRAM 2 according to this exemplary embodiment of the present invention, at least two of the plurality of I/O repair control circuits 200_0~200_n may be in different I/O repair modes. In the exemplary embodiment illustrated in FIG. 11, the first memory block BLK0 is in a ×1 mode, the second memory block BLK1 is in a ×2 mode, and the nth memory block BLKn is in a ×4 mode.

As described above, in the PRAM according to the exemplary embodiment of the present invention, since the I/O repair mode can be adaptively varied according to the location of the failed memory column, the repair efficiency and reliability of the I/O repair mode can be enhanced.

Exemplary embodiments of the present invention have been disclosed herein and they are used and are to be interpreted in a generic and descriptive sense only and not for purposes of limitation. Accordingly, it will be understood by those of ordinary skill in the art that various changes in form and details may be made without departing from the spirit and scope of the present invention, as set forth in the following claims.

What is claimed is:

1. A phase-change random access memory comprising:
   a memory block including a plurality of memory columns corresponding to a same column address and using different input/output paths;
   a redundancy memory block including a plurality of redundancy memory columns using different input/output paths; and
   an input/output controller repairing at least one of the plurality of memory columns using at least one of the plurality of redundancy memory columns, and controlling the number of memory columns simultaneously repaired using the redundancy memory columns in response to an input/output repair mode control signal.

2. The phase-change random access memory of claim 1, wherein the number of memory columns simultaneously repaired using the redundancy memory columns is one of 1, 2, 4, 8, and 16.

3. The phase-change random access memory of claim 1, wherein the input/output repair mode control signal is determined depending on whether at least one control fuse is cut.

4. The phase-change random access memory of claim 1, wherein the memory columns comprise at least one PRAM cell.

5. The phase-change random access memory of claim 1, further comprising:
   a plurality of column address fuse boxes corresponding to the plurality of redundancy memory columns, each of the plurality of column address fuse boxes receiving a column address, for determining whether the plurality of memory columns include at least one repaired memory column, and providing a designation signal for designating the at least one repaired memory column among the plurality of memory columns;
   a control fuse box providing the input/output repair mode control signal for designating input/output repair modes;
   an input/output decoder receiving and decoding the designation signal and the input/output repair mode control signal and providing a plurality of path selection signals; and
   a plurality of path selection circuits receiving the plurality of path selection signals and disabling input/output paths of the at least one repaired memory column and enabling redundancy input/output paths of the at least one redundancy memory column to replace the at least one repaired memory column.

6. The phase-change random access memory of claim 5, wherein the input/output repair modes includes ×1, ×2, ×4, ×8 and ×16 modes.

7. The phase-change random access memory of claim 5, wherein each of the plurality of column address fuse boxes comprises:
   a column address fuse unit including at least one column address fuse, storing a column address of the repaired memory column depending on whether the at least one control fuse is cut, receiving an external column address and determining whether the external column address is identical with the repaired column address stored therein; and
   an input/output information fuse unit including at least one input/output information fuse and providing a designation signal for designating repaired memory columns among the plurality of memory columns depending on whether the at least one input/output information fuse is cut.

8. The phase-change random access memory of claim 7, wherein each of the plurality of column address fuse boxes further comprises a master fuse unit including a master fuse and providing a master signal depending on whether the master fuse is cut, and wherein the column address fuse unit is enabled by the master signal.

9. The phase-change random access memory of claim 5, wherein the plurality of path selection circuits comprises a first path logic circuit enabling/disabling input/output paths of the repaired memory columns and a second path logic circuit enabling/disabling input/output paths of the redundancy memory columns to replace the repaired memory columns.

10. The phase-change random access memory of claim 1, wherein each of the memory columns and redundancy memory columns comprises a plurality of phase-change memory cells, each of the plurality of phase-change memory cells comprises a variable resistor containing a phase change material having at least two resistance values in response to current passing through the phase-change random access memory device cell, and an access element controlling the pass-through current.

11. The phase-change random access memory of claim 10, wherein the access element comprises a diode connected in series to a variable resistor.

12. The phase-change random access memory of claim 11, wherein the phase-change material is made of germanium (Ge), antimony (Sb), and tellurium (Te).

* * * * *